United States Patent
Huang et al.

(10) Patent No.: US 10,128,415 B2
(45) Date of Patent: Nov. 13, 2018

(54) LIGHT SOURCE AND DISPLAY DEVICE USING THE SAME

(71) Applicant: InnoLux Corporation, Miao-Li County (TW)

(72) Inventors: Shih-Chang Huang, Miao-Li County (TW); Wun-Yuan Su, Miao-Li County (TW); Jeng-Wei Yeh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 102 days.

(21) Appl. No.: 15/174,702

(22) Filed: Jun. 6, 2016

(65) Prior Publication Data

US 2016/0372637 A1 Dec. 22, 2016

(30) Foreign Application Priority Data

Jun. 16, 2015 (CN) .......................... 2015 1 0332296

(51) Int. Cl.
*H01L 33/50* (2010.01)
*H01L 27/15* (2006.01)
*H01L 25/075* (2006.01)
*G02F 1/1335* (2006.01)

(52) U.S. Cl.
CPC ........ *H01L 33/50* (2013.01); *G02F 1/133603* (2013.01); *H01L 25/0753* (2013.01); *H01L 27/156* (2013.01); *G02F 2001/133624* (2013.01)

(58) Field of Classification Search
CPC ... H01L 33/50; H01L 25/0753; H01L 27/156; G02F 1/133603; G02F 2001/133624; F21V 9/08; F21V 9/00; F21K 9/00; F21K 9/61; F21Y 2113/10; F21Y 2113/13; F21Y 2115/10

See application file for complete search history.

(56) References Cited

U.S. PATENT DOCUMENTS

| | | | |
|---|---|---|---|
| 2006/0152140 A1* | 7/2006 | Brandes ............... | C09K 11/586 313/503 |
| 2009/0224652 A1* | 9/2009 | Li ...................... | C09K 11/0883 313/498 |

(Continued)

FOREIGN PATENT DOCUMENTS

| | | |
|---|---|---|
| CN | 1637520 A | 7/2005 |
| CN | 101420999 A | 4/2009 |
| CN | 104537954 A | 4/2015 |

OTHER PUBLICATIONS

Chinese language office action dated May 18, 2018, issued in application No. CN 201510332296.1.

*Primary Examiner* — Bao Q Truong
(74) *Attorney, Agent, or Firm* — McClure, Qualey & Rodack, LLP (57) ABSTRACT

A light source for a display device, includes: a first LED chip emitting a first light having a peak located within the range of wavelengths 380 nm to 500 nm, and a second LED chip emitting a second light having a peak located within the range of wavelengths 380 nm to 500 nm, wherein the peak wavelength of the second light is longer than the peak wavelength of the first light, and the difference between the peak wavelength of the second light and the peak wavelength of the first light is less than 40 nm and greater than or equal to 10 nm.

13 Claims, 4 Drawing Sheets

(56) References Cited

U.S. PATENT DOCUMENTS

| | | | |
|---|---|---|---|
| 2011/0235363 A1* | 9/2011 | An | H01L 25/0753 362/606 |
| 2012/0147295 A1* | 6/2012 | Kasano | G02F 1/133603 349/65 |
| 2014/0055982 A1* | 2/2014 | Tao | F21V 9/16 362/84 |
| 2015/0357535 A1* | 12/2015 | Shimonishi | H01L 25/0753 257/89 |

* cited by examiner

FIG. 8

LIGHT SOURCE AND DISPLAY DEVICE USING THE SAME

CROSS REFERENCE TO RELATED APPLICATIONS

This Application claims priority of China Patent Application No. 201510332296.1, filed on Jun. 16, 2015, the entirety of which is incorporated by reference herein.

BACKGROUND

Field of the Disclosure

The present disclosure relates to a light source and a display device using the same, and in particular to the light source emitting blue light with longer peak wavelength.

Description of the Related Art

While display devices are being widely used in various kinds of digital products, the time people spend looking at screens has become longer. Therefore, it's an important research topic to reduce the damage that blue light can do to the human eye. A general blue light cut method provided to the display device attaches a blue light cut film on the display device to restrain the intensity of the blue light. However, while this method can protect the human eye, it reduces the entire brightness of the display device and the image becomes yellowish, which reduces the display quality of the display device.

In view of the above problems, the disclosure improves the light source of the display device to make the display device provide an eye protection (blue-light hazard suppressed) function and maintain its brightness and display quality.

BRIEF SUMMARY

A detailed description is given in the following embodiments with reference to the accompanying drawings.

The disclosure provides a light source of a display device, including: a first LED chip emitting a first light having a peak located within the range of wavelengths 380 nm to 500 nm, and a second LED chip emitting a second light having a peak located within the range of wavelengths 380 nm to 500 nm, wherein the peak wavelength of the second light is longer than the peak wavelength of the first light, and the difference between the peak wavelength of the second light and the peak wavelength of the first light is less than 40 nm and greater than or equal to 10 nm.

According to an embodiment, the first LED chip and the second LED chip are sealed in an LED package.

In the light source of the display device, the peak wavelength of the second light is located between 455 and 465 nm, and when the light source switches to a mode in which the second LED chip emits light, in a spectrum emitted by the LED package the ratio of the peak value in the range of 380~500 nm and the peak value in the range of 500~580 nm is 1:0.25~0.45.

In the light source of the display device, the peak wavelength of the second light is located between 465 and 475 nm, and when the light source switches to a mode in which the second LED chip emits light, in a spectrum emitted by the LED package the ratio of the peak value in the range of 380~500 nm and the peak value in the range of 500~580 nm is 1:0.1~0.3.

In the light source of the display device, there are a plurality of LED packages, and the LED packages are arranged on the back of the display device or along an edge of the display device.

According to another embodiment, the first LED chip and the second LED chip are respectively sealed in a first LED package and a second LED package.

In the light source of the display device, the peak wavelength of the second light is located between 455 and 465 nm, and when the light source switches to a mode in which the second LED chip emits light, in a spectrum emitted by the second LED package the ratio of the peak value in the range of 380~500 nm and the peak value in the range of 500~580 nm is 1:0.25~0.45.

In the light source of the display device, the peak wavelength of the second light is located between 465 and 475 nm, and when the light source switches to a mode in which the second LED chip emits light, in a spectrum emitted by the second LED package the ratio of the peak value in the range of 380~500 nm and the peak value in the range of 500~580 nm is 1:0.1~0.3.

In the light source of the display device, there are a plurality of first LED packages and second LED packages, and the first LED packages and the second LED packages are arranged on the back of the display device or along an edge of the display device. The first LED package and the second LED package are arranged alternately.

The disclosure also provides a display device comprising a display panel and any one of the aforementioned light source which illuminate the display panel.

According to the above light source and the display device, the display device of the disclosure can provide an eye protection (blue-light hazard suppressed) function and maintain its display quality.

BRIEF DESCRIPTION OF THE DRAWINGS

The present disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
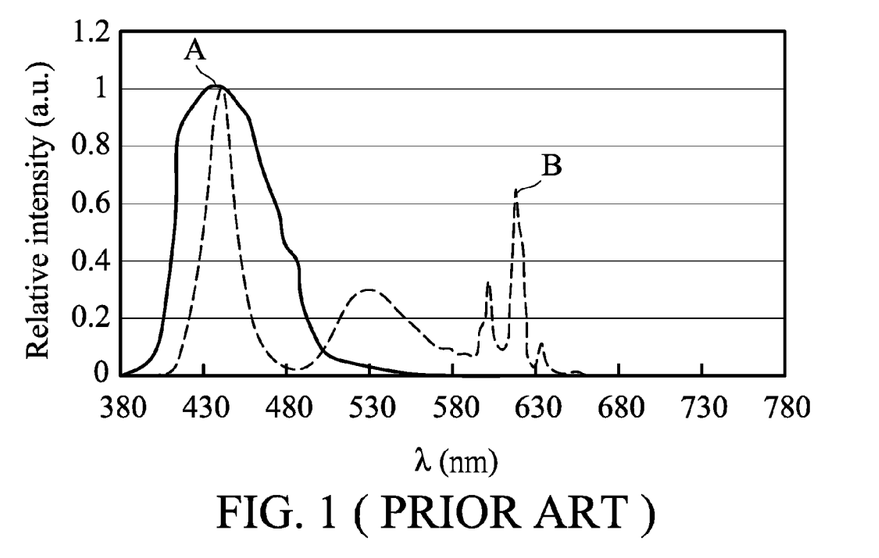
FIG. 1 is a diagram showing a spectrum of an LED light source used in a normal display device and a curve of blue-light hazard function vs. wavelength.

FIG. 1 is a diagram showing a spectrum of an LED light source used in a normal display device and a curve of blue-light hazard function vs. wavelength. In FIG. 1, the horizontal axis represents wavelength (nm) and the vertical axis represents relative intensity (arbitrary unit). A curve A is a spectrum of blue-light hazard function. The value of the blue-light hazard function is between 0 and 1. The higher value means the more damage that blue light makes to the human eye. It can be understood from the curve A that the maximum is at a wavelength of about 440 nm. Further, the intensity of the spectrum of the LED light source used in a normal display device is normalized to make the maximum value of the spectrum equal to 1, and a curve B is obtained in the same figure. It can be understood from the curve B that the peak in the range of blue light (380~500 nm) is also at a wavelength of about 440 nm. Therefore, the spectrum of a common display device exactly makes the most serious damage to the human eye.

Figure 2:
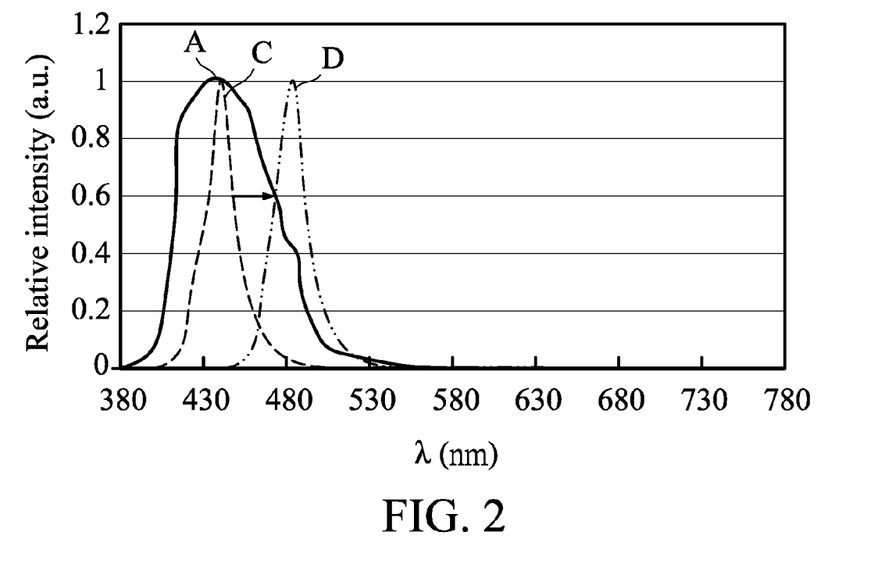
FIG. 2 is a diagram showing a spectrum of long-wavelength blue light, a spectrum of short-wavelength blue light, and the curve of blue-light hazard function vs. wavelength.

According to the above research result, the disclosure provides a light source in which the peak of blue light of the light source spectrum is shifted toward long wavelength from 440 nm, so as to reduce the damage that the light source of the display device makes to the human eye. FIG. 2 is a diagram showing a blue light spectrum emitted from a long-wavelength blue LED chip, a blue light spectrum emitted from a short-wavelength blue LED chip, and the curve of blue-light hazard function vs. wavelength. The spectrum of short-wavelength blue light (not mixed with phosphor) which is emitted from an LED chip of the light source of the normal display device is shown as a curve C of FIG. 2. The wavelength at which the peak of the curve C is located is very close to the wavelength (440 nm) at which the peak of the blue-light hazard function (curve A) is located. The light source of the display device of the disclosure has increased a long-wavelength blue LED chip. The peak of the blue light spectrum emitted from the long-wavelength blue LED chip is shifted toward long wavelength from 440 nm (as shown by a curve D in FIG. 2).

Figure 3:
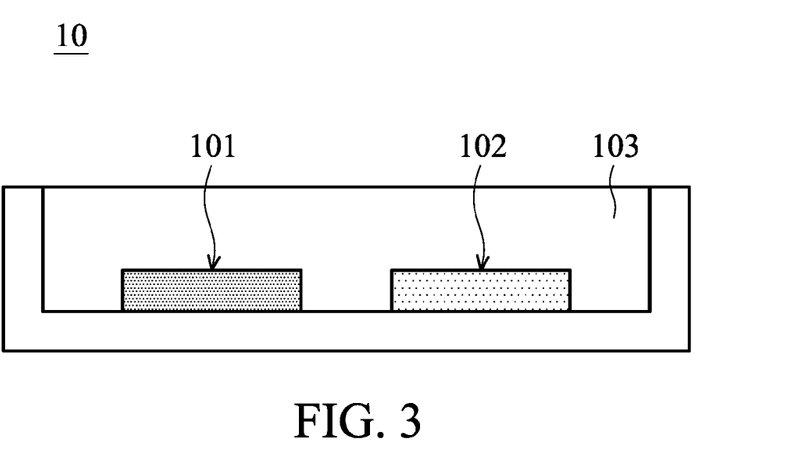
FIG. 3 is a diagram showing an LED package according to Embodiment 1 of the disclosure.

There are two methods to incorporate the LED chip having the blue light spectrum of the curve D into the light source. According to Embodiment 1 of the disclosure, an LED package of the light source of the display device can seal the above short-wavelength blue LED chip and long-wavelength blue LED chip. A normal display mode and an eye protection (blue-light hazard suppressed) mode are performed by switching on one of the short-wavelength blue LED chip and the long-wavelength blue LED chip. In other embodiments, the short-wavelength blue LED chip and the long-wavelength blue LED chip can emit light at the same time to meet design requirements. FIG. 3 is a diagram showing an LED package according to Embodiment 1 of the disclosure. The light source of Embodiment 1 has a plurality of LED packages 10. Each LED package 10 has a short-wavelength blue LED chip 101 and a long-wavelength blue LED chip 102 which is the LED chip emitting blue light spectrum of the curve D. The long-wavelength blue LED chip 102 emits light close to blue-green light. The LED package 10 is filled with phosphor 103, so that light emitted from the short-wavelength blue LED chip 101 or the long-wavelength blue LED chip 102 is absorbed by the phosphor 103 and re-emitted out. The light directly emitted from the LED chips and the light re-emitted from the phosphor 103 is mixed and close to white light. The wavelength of the peak of the spectrum emitted from the short-wavelength blue LED chip 101 is close to 440 nm. The wavelength of the peak of the spectrum emitted from the long-wavelength blue LED chip 102 is longer. The difference between the wavelength of the peak of the spectrum emitted from the long-wavelength blue LED chip 102 and the wavelength of the peak of the spectrum emitted from the short-wavelength blue LED chip 101 is less than 40 nm and more than or equal to 10 nm. Thus, the display device can switch on one of the short-wavelength blue LED chip 101 and the long-wavelength blue LED chip 102 to respectively perform the normal display mode and the eye protection (blue-light hazard suppressed) mode.

Figure 4:
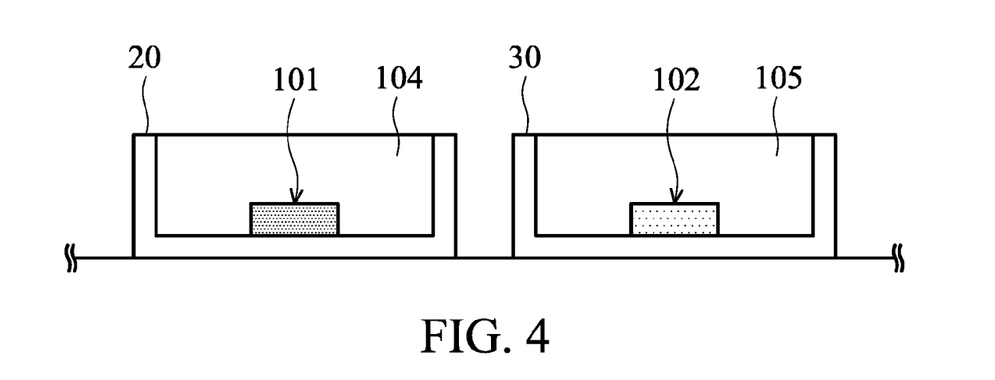
FIG. 4 is a diagram showing an LED package according to Embodiment 2 of the disclosure.

According to Embodiment 2 of the disclosure, the display device can also adopt two kinds of LED packages: an LED package sealing the short-wavelength blue LED chip 101 and the other LED package sealing the long-wavelength blue LED chip 102. The normal display mode and the eye protection (blue-light hazard suppressed) mode are performed by switching on one of the two LED packages. FIG. 4 is a diagram showing an LED package according to Embodiment 2 of the disclosure. The light source of Embodiment 1 has two kinds of LED packages 20 and 30. The LED package 20 seals the short-wavelength blue LED chip 101, and the LED package 30 seals the long-wavelength blue LED chip 102. The LED packages 20 and 30 are respectively filled with phosphor 104 and 105 which can be the same or different. Light emitted from the short-wavelength blue LED chip 101 and the long-wavelength blue LED chip 102 is respectively absorbed by the phosphor 104 and 105 and re-emitted out. The light directly emitted from the LED chips 101 and 102 and the light re-emitted from the phosphor 104 and 105 is mixed and close to white light. Similar to Embodiment 1, the wavelength of the peak of the spectrum emitted from the short-wavelength blue LED chip 101 is close to 440 nm. The wavelength of the peak of the spectrum emitted from the long-wavelength blue LED chip 102 is longer. The difference between the wavelength of the peak of the spectrum emitted from the long-wavelength blue LED chip 102 and the wavelength of the peak of the spectrum emitted from the short-wavelength blue LED chip 101 is less than 40 nm and more than or equal to 10 nm. Thus, the display device can switch on one of the LED package 30 and the LED package 40 to respectively perform the normal display mode and the eye protection (blue-light hazard suppressed) mode.

Figure 5:
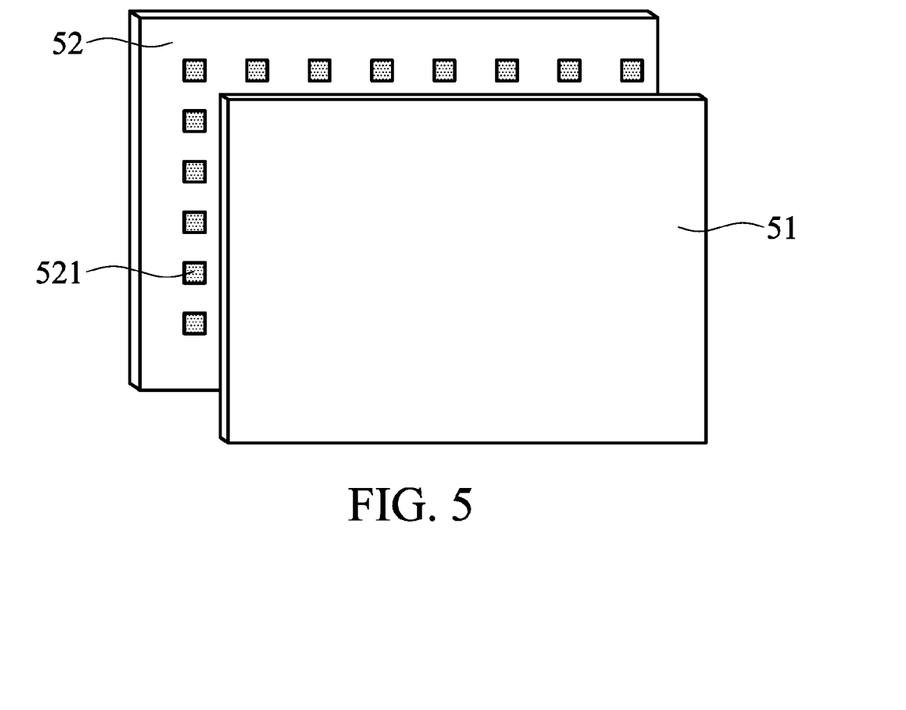
FIG. 5 is a diagram showing an embodiment of a light source of the disclosure.

There are two examples to show how the LED packages of Embodiment 1 or Embodiment 2 are arranged in a light source. FIG. 5 is a diagram showing an embodiment of a light source of the disclosure. As shown in FIG. 5, a display device 5 comprises a liquid-crystal panel 51 and a light source 52. In the embodiment, the light source 52 is a backlight of the display. As shown in FIG. 5, a plurality of LED packages 521 are disposed in a matrix on a surface of the light source 52 facing the liquid-crystal panel 51. It is possible that all of the LED packages 521 of the light source 52 are the LED packages 10, or a portion of the LED packages 521 are the LED packages 20 and the other portion of the LED packages 521 are the LED packages 30. In the latter case, the LED packages 20 and the LED packages 30 can be arranged alternately in an interlaced pattern or a checkerboard pattern (for example, 20, 30, 20, 30, 20, 30, . . . ), but not limited thereto. Therefore, no matter which of the LED packages 20 and the LED packages 30 emit light, the entire liquid-crystal panel 51 can be illuminated uniformly. The liquid-crystal panel 51 can be a curve display or a flexible display.

Figure 6:
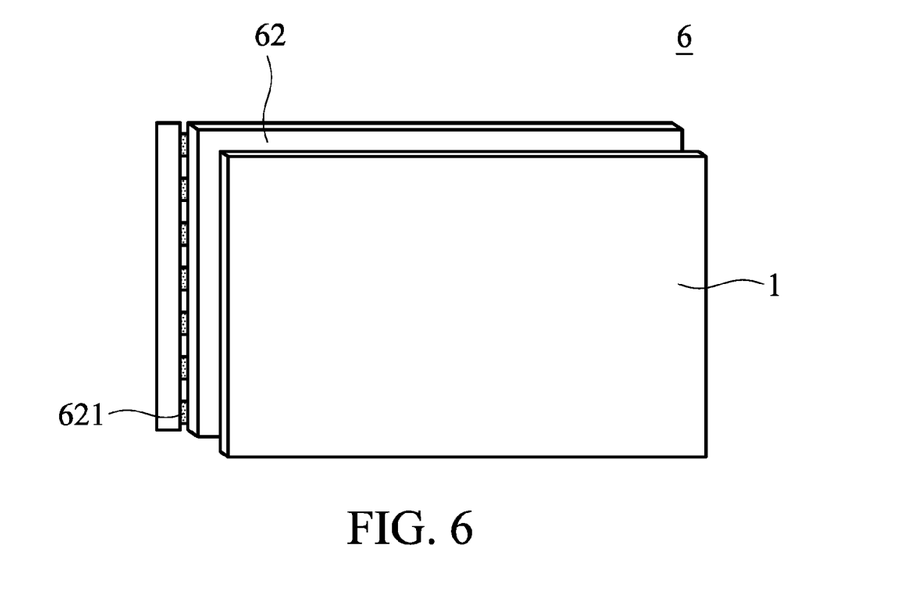
FIG. 6 is a diagram showing another embodiment of a light source of the disclosure.

FIG. 6 is a diagram showing another embodiment of a light source of the disclosure. As shown in FIG. 6, a display device 6 comprises the liquid-crystal panel 51 and a light source 62. The difference between FIG. 6 and FIG. 5 is that the structure of the light source 62 is different from the light source 52. As shown in FIG. 6, the light source 62 has a plurality of LED packages 621 arranged in at least a line along an edge of the display device 6. The light emitted from the LED packages 621 passes through optical components such as a light guide and is converted to planar light illuminating the liquid-crystal panel 51. Similarly, it is possible that all of the LED packages 621 of the light source 62 are the LED packages 10, or a portion of the LED packages 621 are the LED packages 20 and the other portion of the LED packages 621 are the LED packages 30. In the latter case, the LED packages 20 and the LED packages 30 can be arranged alternately in a checkerboard pattern or an interlaced pattern (for example, 20, 30, 20, 30, 20, 30, . . . ), but not limited thereto. Therefore, no matter which of the LED packages 20 and the LED packages 30 emit light, the entire liquid-crystal panel 51 can be illuminated uniformly.

In another embodiment (not shown), a plurality of LED packages are disposed in a matrix on a surface of a substrate as the LED display. It is possible that all of the LED packages of the light source are the LED packages 10, or a portion of the LED packages are the LED packages 20 and the other portion of the LED packages are the LED packages 30. The LED packages 20 and the LED packages 30 can be arranged alternately in an interlaced or a checkerboard pattern (for example, 20, 30, 20, 30, 20, 30, . . . ), but not limited thereto. The material of the substrate may be glass, plastic, flexible materials, or other suitable substrates.

According to Embodiments 1 and 2 and examples, the display device can switch between the normal display mode and the eye protection mode. When the eye protection mode is performed, the display device can provide an effect of reducing the damage that blue light makes to the human eye.

The degree how much the embodiment of the disclosure reduces the damage that blue light makes to the human eye can be evaluated by the following equation.

$$K_{B,v} = \frac{\Phi_B}{\Phi_v} = \frac{\int_{380}^{780} \Phi_{e,\lambda}(\lambda) \cdot B(\lambda) \cdot d\lambda}{K_m \cdot \int_{380}^{780} \Phi_{e,\lambda}(\lambda) \cdot V(\lambda) \cdot d\lambda}$$

In the above equation, regarding numerator, $\Phi_{e,\lambda}$ is a module blue light spectrum. Namely, the curve B shown in FIG. 1. $B(\lambda)$ is the blue-light hazard function. Namely, the curve A shown in FIG. 1. The integral from 380 nm to 780 nm (visible light band) of the product of $\Phi_{e,\lambda}$ and $B(\lambda)$ is $\Phi_B$. $\Phi_B$ is radiant flux weighted by the blue-light hazard function. Regarding denominator, $\Phi_{e,\lambda}$ still represents a module blue light spectrum. $V(\lambda)$ is a luminous efficiency function. The value of the luminous efficiency function is from 0 to 1 and represents the average spectral sensitivity of human visual perception of brightness. The integral from 380 nm to 780 nm (visible light band) of the product of $\Phi_{e,\lambda}$ and $V(\lambda)$ multiplied by the maximum luminous efficacy $K_m$ (683 lm/W) equals light flux $\Phi_v$. The ratio $K_{B,v}$ of the numerator to the denominator is the degree of blue-light hazard of the light source (no unit).

Using this equation, the degree of blue-light hazard of the light source in which the peak of blue light is at a wavelength of 440 nm, 450 nm, 460 nm, 470 nm and 480 nm can be calculated.

CHART 1

| wavelength | 440 nm | 450 nm | 460 nm | 470 nm | 480 nm |
| --- | --- | --- | --- | --- | --- |
| degree of blue-light hazard | 0.016 | 0.013 | 0.010 | 0.007 | 0.004 |

It can be understood from chart 1 that the more the peak wavelength of the blue light spectrum emitted by the LED chip is shifted away from 440 nm, the lower the degree of blue-light hazard $K_{B,v}$ is.

When a white light source is manufactured, the color of white light which is finally output from the white light source may be influenced by the change of the blue light spectrum of the blue LED chip. Therefore, the peak wavelength in green light band and the peak wavelength in blue light band have to be adjusted to maintain the coordinates of the white light in the color space.

Figure 7:
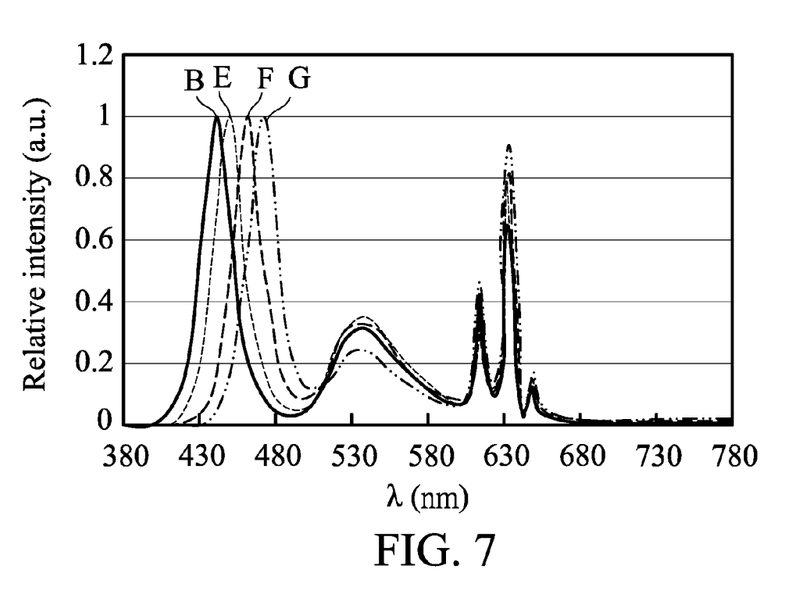
FIG. 7 is a diagram showing a spectrum of a normal light source and spectrums of the light source of the disclosure in which the peak of blue light is at a wavelength of 450 nm, 460 nm, and 470 nm.

FIG. 7 shows four spectrums which are respectively emitted by four kinds of light sources. The four light sources are provided with different blue LED chips. Each spectrum shown in FIG. 7 is measured under the condition that a display device having one of the four light sources displays a white image (gray level=255). The spectrums are module brightness spectrums. Each spectrum is normalized to make the maximum value of the blue light peak equal to 1, and a normalized module brightness spectrum is obtained. In FIG. 7, curve B is the spectrum of a light source provided with a short-wavelength blue LED chip, wherein the peak wavelength $\lambda_{peak-b}$ in the blue light band (380 nm-500 nm) is about 440 nm. Curve E is the spectrum of a light source provided with a long-wavelength blue LED chip, wherein the peak wavelength $\lambda_{peak-e}$ in the blue light band (380 nm-500 nm) is adjusted to about 450 nm. Curve F is the spectrum of a light source provided with a long-wavelength blue LED chip, wherein the peak wavelength $\lambda_{peak-f}$ in the blue light band (380 nm-500 nm) is adjusted to about 460 nm. Curve G is the spectrum of a light source provided with a long-wavelength blue LED chip, wherein the peak wavelength $\lambda_{peak-g}$ in the blue light band (380 nm-500 nm) is adjusted to about 470 nm.

In the normalized module brightness spectrums shown in FIG. 7, when the peak wavelength in the blue light band as shown by the curve B (435 nm≤$\lambda_{peak-b}$<445 nm) is shifted to the peak wavelength in the blue light band as shown by the curve E (445 nm≤$\lambda_{peak-e}$<455 nm), the ratio of the peak value in the blue light band (380 nm~480 nm) and the peak value in the green light band (500 nm~580 nm) should be in the range of 1:0.3~0.5 to maintain the coordinates of the original white light in the color space (the coordinate variation distance is less than 0.01). When the peak wavelength in the blue light band as shown by the curve B (435 nm≤$\lambda_{peak-b}$<455 nm) is shifted to the peak wavelength in the blue light band as shown by the curve F (455 nm≤$\lambda_{peak-f}$<465 nm), the ratio of the peak value in the blue light band (380 nm~480 nm) and the peak value in the green light band (500 nm~580 nm) should be in the range of 1:0.25~0.45 to maintain the coordinates of the original white light in the color space (the coordinate variation distance is less than 0.01). When the peak wavelength in the blue light band as shown by the curve B (435 nm≤$\lambda_{peak-b}$<445 nm) is shifted to the peak wavelength in the blue light band as shown by the curve G (465 nm≤$\lambda_{peak-g}$<475 nm), the ratio of the peak value in the blue light band (380 nm~480 nm) and the peak value in the green light band (500 nm~580 nm) should be in the range of 1:0.1~0.3 to maintain the coordi-nates of the original white light in the color space (the coordinate variation distance is less than 0.01). As shown in FIG. 7, when the peak wavelength in the blue light band is shifted, the peak value n the green light band (500 nm~580 nm) is adjusted accordingly. The ratio of the peak value in the blue light band and the peak value in the green light band should be in the range of 1:0.1~0.5. Thus, the coordinates of the original white light in the color space or the visual sensation of the user watching a white image can be maintained.

Figure 8:
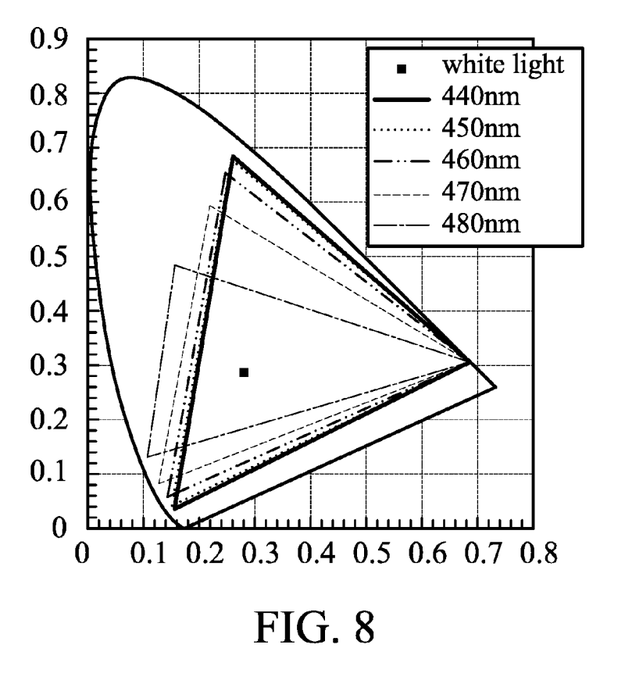
FIG. 8 is a diagram showing the color gamut of display devices using different LED chips of the disclosure in CIE1931 color space.

The following description is about the display quality influenced by a shifted peak wavelength in the blue light band. FIG. 8 is a diagram showing the color gamut of the display devices using different LED chips of the disclosure in CIE1931 color space. Specifically, FIG. 8 shows the color gamut of the display device using an LED chip emitting blue light with one of the following peak wavelengths: 440 nm, 450 nm, 460 nm, 470 nm, and 480 nm. The color temperature is 9300K and the coordinates of the white light are maintained at (0.28, 0.29) in CIE1931 color space. It can be seen in FIG. 8 that the more the peak wavelength in the blue light band is shifted toward long wavelength, the smaller the color gamut (the triangle surrounded by three points of red, green, and blue) is. Therefore, the ratio of the peak value in the blue light band and the peak value in the green light band should be adjusted to meet the requirements for the white point. When the peak wavelength in the blue light band is at 440 nm, 450 nm, 460 nm, 470 nm, and 480 nm, the coordinates of the red, green, and blue points shown in FIG. 8 are listed in Chart 2.

CHART 2

| peak wavelength in the blue light band | percentage of blue-light hazard (BHR %) | White point x | White point y | Red point x | Red point y | Green point x | Green point y | Blue point x | Blue point y |
|---|---|---|---|---|---|---|---|---|---|
| 440 nm | 100% | 0.280 | 0.290 | 0.683 | 0.311 | 0.260 | 0.688 | 0.156 | 0.042 |
| 450 nm | 71.8% | 0.280 | 0.290 | 0.684 | 0.311 | 0.258 | 0.682 | 0.151 | 0.047 |
| 460 nm | 50.3% | 0.280 | 0.290 | 0.686 | 0.310 | 0.248 | 0.657 | 0.140 | 0.061 |
| 470 nm | 39.9% | 0.280 | 0.290 | 0.687 | 0.309 | 0.221 | 0.596 | 0.126 | 0.086 |
| 480 nm | 32.3% | 0.280 | 0.290 | 0.689 | 0.306 | 0.158 | 0.489 | 0.105 | 0.135 |

The percentage of blue-light hazard (BHR %) mentioned in Chart 2 is obtained by normalize the aforementioned $K_{B,v}$ with module brightness. The equation is $$BHR \% = K_{B,v} \cdot \frac{\int_{380}^{780} \Phi_{e,\lambda 1}(\lambda) \cdot V(\lambda) \cdot d\lambda}{\int_{380}^{780} \Phi_{e,\lambda 2}(\lambda) \cdot V(\lambda) \cdot d\lambda}$$

$\Phi_{e,\lambda 1}(\lambda)$ is an experimental module spectrum, $\Phi_{e,\lambda 2}(\lambda)$ is a control module spectrum, and $V(\lambda)$ is a luminous efficiency function. More specifically, $\Phi_{e,\lambda}(\lambda)$ is the integral of the product of the light source spectrum $BL(\lambda)$ and the panel transmittance spectrum panel $(\lambda)$.

$$\Phi_{e,\lambda}(\lambda) = \int_{380}^{780} BL(\lambda) \cdot panel(\lambda) \cdot d\lambda$$

As shown in FIG. 8, when the peak wavelength in the blue light band is 450 nm or 460 nm, the color gamut doesn't decrease too much in comparison with cases where the peak wavelength in the blue light band is 440 nm. However, once the peak wavelength in the blue light band is shifted to more than 470 nm, the gamut decreases a lot. Therefore, in Embodiments 1 and 2, if the gamut size is taken into prior consideration, it is preferred that the difference between the peak wavelength emitted from the long-wavelength blue LED chip 102 and the peak wavelength emitted from the short-wavelength blue LED chip 101 is within 20 nm, but the degree of blue light hazard doesn't decrease as much as other long-wavelength blue LEDs having a longer peak wavelength in blue light band can do. When the peak wavelength of light emitted from the long-wavelength blue LED chip 102 is 460 nm, the degree of blue light hazard decreases to about one half of that of the blue LED chip with a peak wavelength of 440 nm. In this case, the degree of blue light hazard can be significantly reduced while the display quality is maintained (only little decrease in color gamut). If the decrease of blue light hazard is taken into prior consideration and the gamut is not strictly demanded, it is preferred that the peak wavelength emitted from the long-wavelength blue LED chip 102 is 470 nm or 480 nm.

It is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements. For example, the arrangement for the LED package 20 and LED package 30 described in Embodiment 2 is not limited to a checkerboard pattern or an interlaced pattern. There are a lot of arrangements can be utilized so as to make the light source illuminate light to meet the design requirements. In addition, when the light source is an edge-emitting light source, the LED package 20 and LED package 30 is not limited to being arranged along an edge of the display device. The LED package 20 and LED package 30 can be arranged along two or more edges of the display device. Furthermore, a preferred ratio for the peak value in the blue light band and the peak value in the green light band for maintaining the coordinates of the white light in the color space is described, but if the LED package utilizes yellow phosphor, the ratio is also applicable for the peak value in the blue light band and the peak value in the yellow light band.

What is claimed is:

1. A light source of a display device, comprising
a first LED chip emitting a first light having a peak wavelength located within a range of wavelengths 380 nm to 500 nm, and
a second LED chip emitting a second light having a peak wavelength located within a range of wavelengths 455 nm to 465 nm,
wherein the peak wavelength of the second light is longer than the peak wavelength of the first light,
a difference between the peak wavelength of the second light and the peak wavelength of the first light is less than 40 nm and greater than or equal to 10 nm, and
when the light source switches to a mode in which the second LED chip emits light, in a spectrum emitted by an LED package having the second LED chip, the ratio of a peak value of the spectrum located between 380 nm and 500 nm to a peak value of the spectrum located between 500 nm and 580 nm is in a range between 1:0.25 and 1:0.45.

2. The light source of the display device as claimed in claim 1, wherein the first LED chip and the second LED chip are sealed in the same LED package.

3. The light source of the display device as claimed in claim 2, wherein there are a plurality of the LED packages, and
the LED packages are arranged on the back of the display device or along an edge of the display device.

4. The light source of the display device as claimed in claim 1, wherein the first LED chip and the second LED chip are respectively sealed in different LED packages.

5. The light source of the display device as claimed in claim 4, wherein there are a plurality of the LED packages having the first LED chip and the LED packages having the second LED chip, and
the LED packages having the first LED chip and the LED packages having the second LED chip are arranged on the back of the display device or along an edge of the display device.

6. The light source of the display device as claimed in claim 5, wherein the LED package having the first LED chip and the LED package having the second LED chip are arranged alternately.

7. A display device, comprising
a display panel, and
a light source illuminating the display panel and comprising:
a first LED chip emitting a first light having a peak wavelength located within a range of wavelengths 380 nm to 500 nm, and
a second LED chip emitting a second light having a peak wavelength located within a range of wavelengths 455 nm to 465 nm,
wherein the peak wavelength of the second light is longer than the peak wavelength of the first light,
a difference between the peak wavelength of the second light and the peak wavelength of the first light is less than 40 nm and greater than or equal to 10 nm, and
when the light source switches to a mode in which the second LED chip emits light, in a spectrum emitted by an LED package having the second LED chip, a ratio of a peak value of the spectrum located between 380 nm and 500 nm to a peak value of the spectrum located between 500 nm and 580 nm is in a range between 1:0.25 and 1:0.45.

8. The display device as claimed in claim 7, wherein the first LED chip and the second LED chip are sealed in the same LED package.

9. The display device as claimed in claim 8, wherein there are a plurality of the LED packages, and
the LED packages are arranged on the back of the display device or along an edge of the display device.

10. The display device as claimed in claim 7, wherein the first LED chip and the second LED chip are respectively sealed in different LED packages.

11. The display device as claimed in claim 10, wherein there are a plurality of the LED packages having the first LED chip and the LED packages having the second LED chip, and
the LED packages having the first LED chip and the LED packages having the second LED chip are arranged on the back of the display device or along an edge of the display device.

12. The display device as claimed in claim 11, wherein the LED package having the first LED chip and the LED package having the second LED chip are arranged alternately.

13. A display device, comprising
a display panel, and
a light source illuminating the display panel and comprising:
a first LED chip emitting a first light having a peak wavelength located within the range of wavelengths 380 nm to 500 nm, and
a second LED chip emitting a second light having a peak wavelength located within the range of wavelengths 465 nm to 475 nm,
wherein the peak wavelength of the second light is longer than the peak wavelength of the first light,
a difference between the peak wavelength of the second light and the peak wavelength of the first light is less than 40 nm and greater than or equal to 10 nm, and
when the light source switches to a mode in which the second LED chip emits light, in a spectrum emitted by an LED package having the second LED chip, the ratio of a peak value of the spectrum located between 380 nm and 500 nm to a peak value of the spectrum located between 500 nm and 580 nm is in a range between 1:0.1 and 1:0.3.

* * * * *